(12) United States Patent
Shirley

(10) Patent No.: US 9,190,341 B2
(45) Date of Patent: Nov. 17, 2015

(54) LIDDED INTEGRATED CIRCUIT PACKAGE

(75) Inventor: Dwayne Richard Shirley, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 571 days.

(21) Appl. No.: 13/489,297

(22) Filed: Jun. 5, 2012

(65) Prior Publication Data

US 2013/0320517 A1 Dec. 5, 2013

(51) Int. Cl.
*H01L 23/12* (2006.01)
*H01L 23/10* (2006.01)
(Continued)

(52) U.S. Cl.
CPC ............ *H01L 23/3735* (2013.01); *B32B 37/12* (2013.01); *B32B 37/18* (2013.01); *H01L 23/06* (2013.01); *H01L 23/3675* (2013.01); *B32B 2457/00* (2013.01); *H01L 2224/16225* (2013.01); *H01L 2224/32225* (2013.01); *H01L 2224/73204* (2013.01); *H01L 2224/73253* (2013.01); *H01L 2924/15311* (2013.01); *H01L 2924/16152* (2013.01)

(58) Field of Classification Search
CPC .................. H01L 2924/161; H01L 2924/1611; H01L 2924/1615; H01L 2924/16151; H01L 2924/16152; H01L 2924/1617; H01L 2924/16171; H01L 2924/16172; H01L 2924/16173; H01L 2924/16196; H01L 2924/162; H01L 2924/6235; H01L 2924/1626; H01L 2924/163; H01L 2924/1631; H01L 2924/16315; H01L 2924/164; H01L 2924/165; H01L 2924/16586; H01L 2924/166; H01L 2924/167; H01L 2924/16701; H01L 2924/16717; H01L 2924/16747; H01L 2924/16563; H01L 2924/16786; H01L 2924/16738; H01L 2224/16225; H01L 2224/32225; H01L 2224/73204; H01L 2924/15311; H01L 2924/00; H01L 2224/73253; H01L 23/06; H01L 23/3675; H01L 23/298; H01L 23/36; H01L 23/373; H01L 23/3736; H01L 23/14; H01L 2924/01028; H01L 2924/01029; H01L 21/4803; H01L 21/4871; H01L 21/02164; H01L 2023/4037; H01L 2023/4056; H01L 23/02; H01L 23/10; H01L 2924/16174; H01L 2924/16587; H01L 2924/16787; B32B 2457/00; B32B 37/12; B32B 37/18; H01L 2924/16153; H01L 23/3735
USPC .......... 257/704, 706, 717, E23.101, E23.181; 165/185; 156/330; 428/446, 450
See application file for complete search history.

(56) References Cited

U.S. PATENT DOCUMENTS 4,894,352 A 1/1990 Lane et al.
4,975,762 A * 12/1990 Stradley et al. ............... 257/660
(Continued)

OTHER PUBLICATIONS

D.D.L. Chung, "Polymer-Matrix Composites for Microelectronics" in Polymers & Polymer Composites, vol. 8, No. 4, 2000, pp. 219 to 229.

(Continued)

*Primary Examiner* — Teresa M Arroyo
(74) *Attorney, Agent, or Firm* — Steven A. Shaw; Charles A. Brill; Frank D. Cimino

(57) ABSTRACT

A lid comprising a heat conductive substrate and a native silicon oxide layer connected to said substrate by at least one intermediate layer; a lidded integrated circuit package; and a method of providing a heat path through an integrated circuit package comprising providing a substrate with an exterior layer of native silicon oxide and interfacing the layer of native silicon oxide with a layer of thermal interface material.

10 Claims, 4 Drawing Sheets

(51) Int. Cl.
*H01L 23/34* (2006.01)
*H01L 23/373* (2006.01)
*H01L 23/06* (2006.01)
*H01L 23/367* (2006.01)
*B32B 37/12* (2006.01)
*B32B 37/18* (2006.01)

(56) References Cited

U.S. PATENT DOCUMENTS

| | | | | |
|---|---|---|---|---|
| 4,996,589 | A * | 2/1991 | Kajiwara et al. | 257/714 |
| 6,331,731 | B1 * | 12/2001 | Kelly et al. | 257/704 |
| 7,651,938 | B2 * | 1/2010 | Too et al. | 438/615 |
| 8,063,482 | B2 * | 11/2011 | Lu | 257/704 |
| 8,212,351 | B1 * | 7/2012 | Debar et al. | 257/704 |
| 2002/0074649 | A1 * | 6/2002 | Chrysler et al. | 257/720 |
| 2002/0113306 | A1 * | 8/2002 | Kwon et al. | 257/691 |
| 2003/0067070 | A1 * | 4/2003 | Kwon et al. | 257/706 |
| 2003/0080411 | A1 * | 5/2003 | Baek et al. | 257/704 |
| 2007/0230130 | A1 * | 10/2007 | Alcoe et al. | 361/704 |
| 2008/0156474 | A1 * | 7/2008 | Simion | 165/185 |
| 2008/0156635 | A1 * | 7/2008 | Simon | 204/192.1 |
| 2008/0230893 | A1 * | 9/2008 | Too et al. | 257/704 |
| 2009/0057877 | A1 * | 3/2009 | Touzelbaev et al. | 257/706 |
| 2010/0319898 | A1 * | 12/2010 | Underwood et al. | 165/185 |

OTHER PUBLICATIONS

Shih-Fang Chuang & David R. Kee, "Effects of Polymer Die Attach-Leadframe Interface Integrity on Thermal Performance of Power Semiconductor Packages" in 1997 Electronic Components and Technology Conference, pp. 1061 to 1067.

Angela D. McConnell, Srinivasan Uma, Kenneth E. Goodson, "Thermal Conductivity of Doped Polysilicon Layers" in Journal of Microelectromechanical Systems, vol. 10, No. 3, Sep. 2001, pp. 360 to 369.

M. Morita, T. Ohmi, E. Hasegawa, M. Kawakami & M. Ohwada, "Growth of Native Oxide on a Silicon Surface", in 1990 American Institute of Physics, pp. 1272 to 1281.

Zhonghe Jin, Gururaj A. Bhat, Milton Yeung, Hoi S. Kowk, & Man Wong, "Nickel Induced Crystallization of Amorphous Silicon Thin Films," in Journal of Applied Physics, vol. 84, No. 1, pp. 194 to 200.

* cited by examiner

LIDDED INTEGRATED CIRCUIT PACKAGE

BACKGROUND

Lidded integrated circuit packages ("lidded IC packages") are often used with semiconductor dies and/or printed circuit boards ("PC boards") that generate significant amounts of heat. A typical lidded IC package includes a semiconductor die mounted on an electrical connection substrate. A lid, made from a conductive material is mounted on the substrate on the same side as the die. The lid completely encloses the semiconductor die, which is positioned beneath it. A thermal interface material such as silicone or epoxy is positioned between the die and the lid. The thermal interface material facilitates heat flow between the semiconductor die and the lid. A heat sink is typically mounted on the upper surface of the lid to receive and disperse heat from the lid.

Currently most lids are made of nickel coated copper. The nickel layer is, in turn, coated with a silicon oxide material applied by physical vapor deposition. Physical vapor deposition typically uses evaporation or sputtering techniques to apply a silicon dioxide coating by condensation of vapors in a vacuum resulting in adhesion between the deposited atoms and atoms of the nickel layer. The silicon oxide layer of the lid interfaces with the thermal interface material that is applied to it.

DETAILED DESCRIPTION

Figure 1:
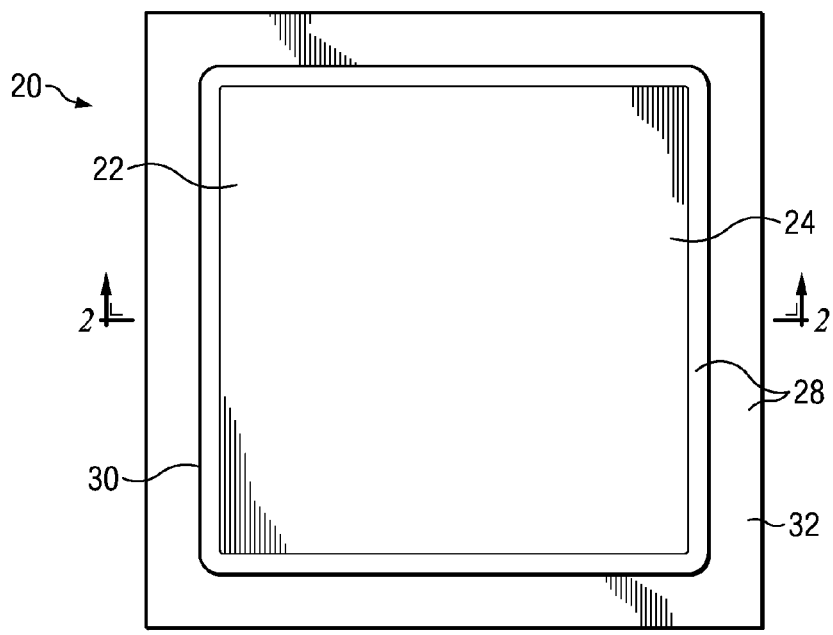
FIG. 1 is a top plan view of a lid for a lidded IC package.
Figure 2:
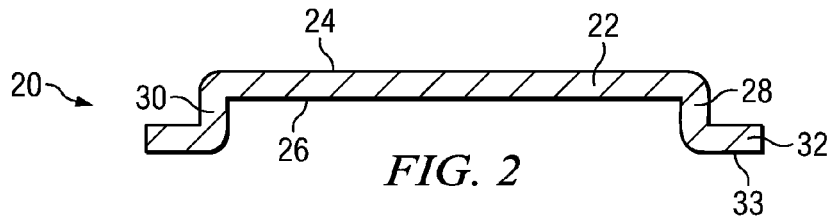
FIG. 2 is a cross-sectional view of the lid of FIG. 1.
Figure 3:
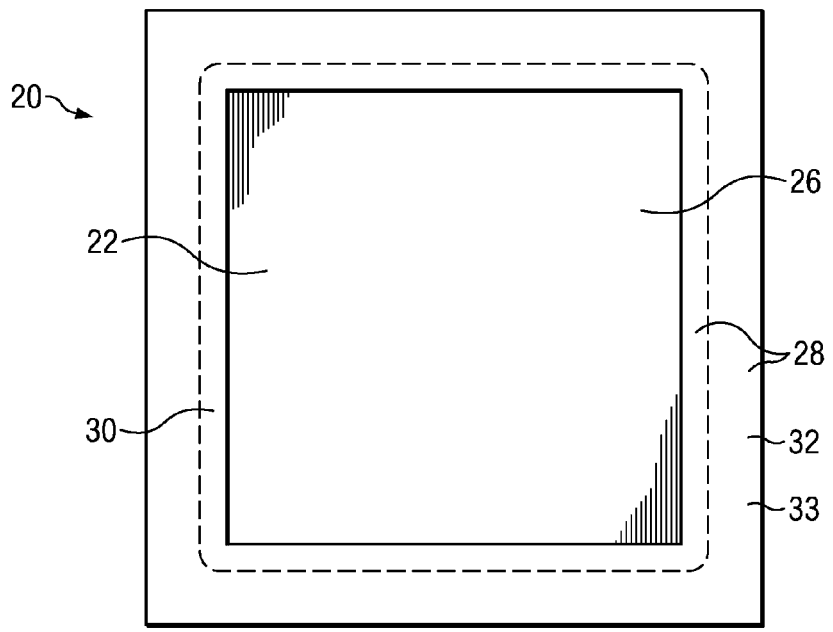
FIG. 3 is a bottom plan view of the lid of FIG. 1.

In this disclosure terms such as up, down, top, bottom, vertical, lateral and the like are used in a relative sense to describe the positional relationship of various components of a lidded IC package 10 and adjacent structure. These terms are used with reference to the position of components shown in the drawing, not in an absolute sense with reference to a field of gravity. Thus, for example, a surface shown in the drawing and referred to as the top surface 72 of die 70 would still be properly referred to as the top surface of the die, even if, in a real world situation, the die were placed in an inverted position with respect to the position shown and described in this disclosure.

This description, in general, discloses a lidded integrated circuit (IC) package 10 that has a lid 20 with a heat conductive substrate 21 and a native silicon oxide layer 54 connected to said substrate 21 by at least one intermediate layer, 40, 50. These intermediate layers may include a nickel layer 40 coated on the substrate 21 and a crystallized amorphous silicon film layer 50 interfacing with the nickel layer 40. The native silicon oxide layer 54 may be formed on the crystallized amorphous silicon film layer 50. The heat conductive substrate 21 may be a copper substrate. The substrate 21 may have a generally rectangular central body 22 and a peripheral flange 28 extending from the central body portion 22.

The lidded IC package 10 may include a semiconductor die 70 mounted on an electrical connection substrate 80. The flange 28 of the lid 20 may be mounted on the electrical connection substrate 80 such that the central body 22 of the lid is positioned over the die 70. A layer of thermal interface material 60 is attached to the top surface of the semiconductor die 70 and to the native silicon oxide layer 54 of the lid. The layer of thermal interface material 60 may be silicone or epoxy resin with thermally conductive filler media.

Having thus described the structure of a lidded IC package generally, the lidded IC package and way it is produced will now be described in greater detail.

Figure 4:
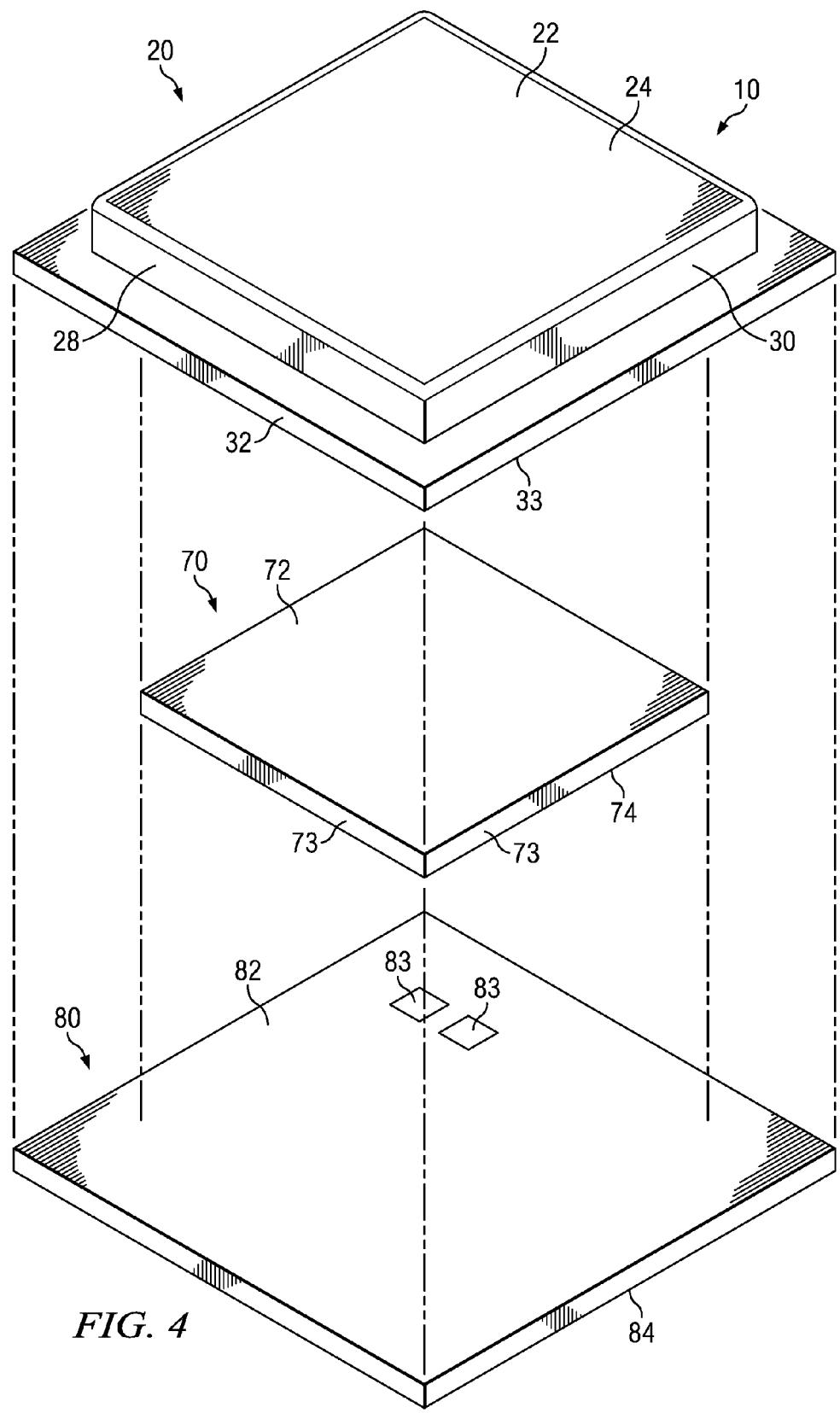
FIG. 4 is an exploded perspective view of the principal components of a lidded IC package.
Figure 5:
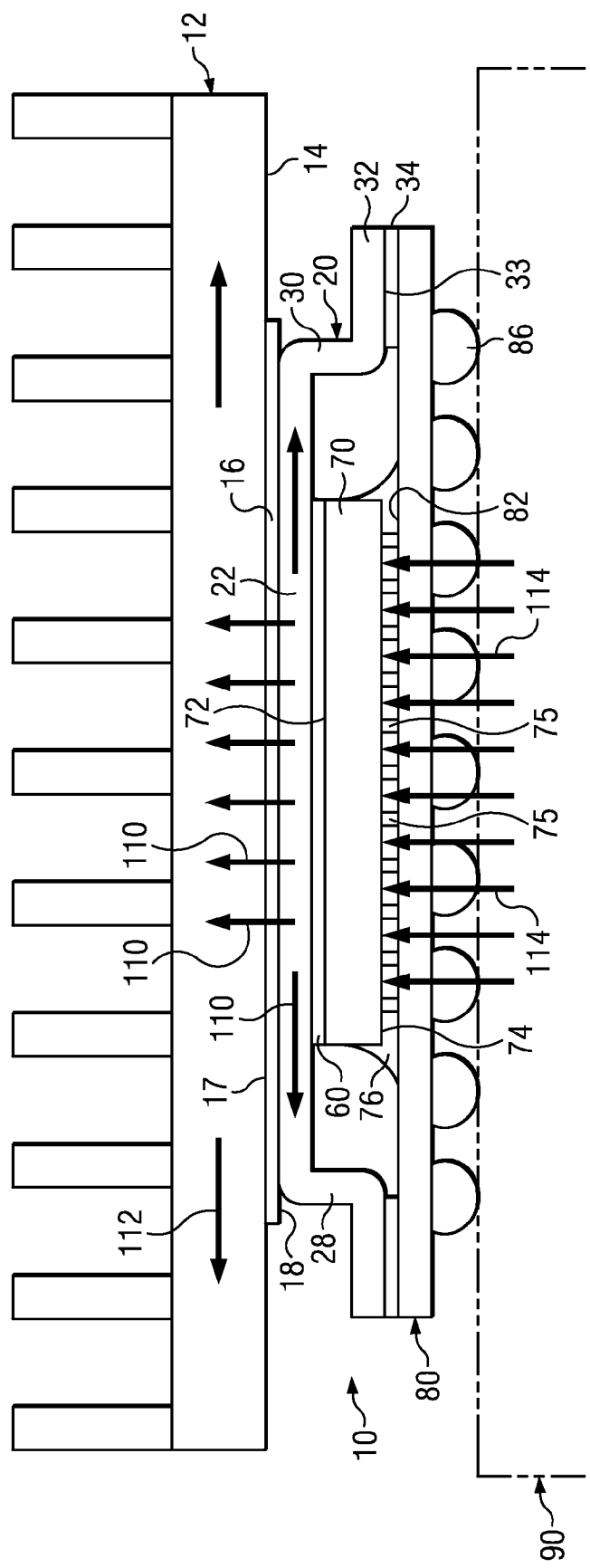
FIG. 5 is a cross-sectional view of a lidded IC package having a heat sink mounted thereon.

FIG. 5 is a cross sectional view of the entire lidded IC package 10 with a heat sink 12 mounted on top of it. FIGS. 1-4 show that the lid 20 has an inverted, open, box shape. The lid 20 includes a generally rectangular central body 22 having a top surface 24 and a bottom surface 26. The lid further includes a peripheral flange 28 extending from the central body 22. The peripheral flange 28 has a generally vertically disposed leg portion 30 and a laterally outwardly extending foot portion 32 with a bottom surface 33. Although the embodiment of the lid shown in the drawings is a "top hat" type lid, other types of lids such as "flat lids" and "cavity lids" may also be used. FIG. 4 shows that the die 70 and substrate 80 both have a generally box shaped appearance. FIG. 4 further shows the general positional relationship of the lid 20, semiconductor die 70 and electrical connection substrate 80. The die 70 is mounted above the electrical connection substrate 80. The lid 20 is mounted above both the substrate 80 and the die 70. The lid 20 and substrate 80 enclose the die 70 on all sides, top and bottom.

Referring to FIG. 5, the heat sink 12 shown is a fin type, air-cooled heat sink, but any other type of heat sink including a liquid cooled heat sink might be used as well, depending upon the particular application. The heat sink 12 has a bottom surface 14 which interfaces with a layer of thermal interface material 16 having a top surface 17 and a bottom surface 18. Various types of thermal interface material may be used such as thermal grease, thermal gel, or graphite sheet interface material, all of which are known in the art. The methods of applying and using such thermal interface material are also well known in the art and will thus not be further described herein. The thermal interface material 16 is applied to a top portion of a lid 20.

Figure 6:
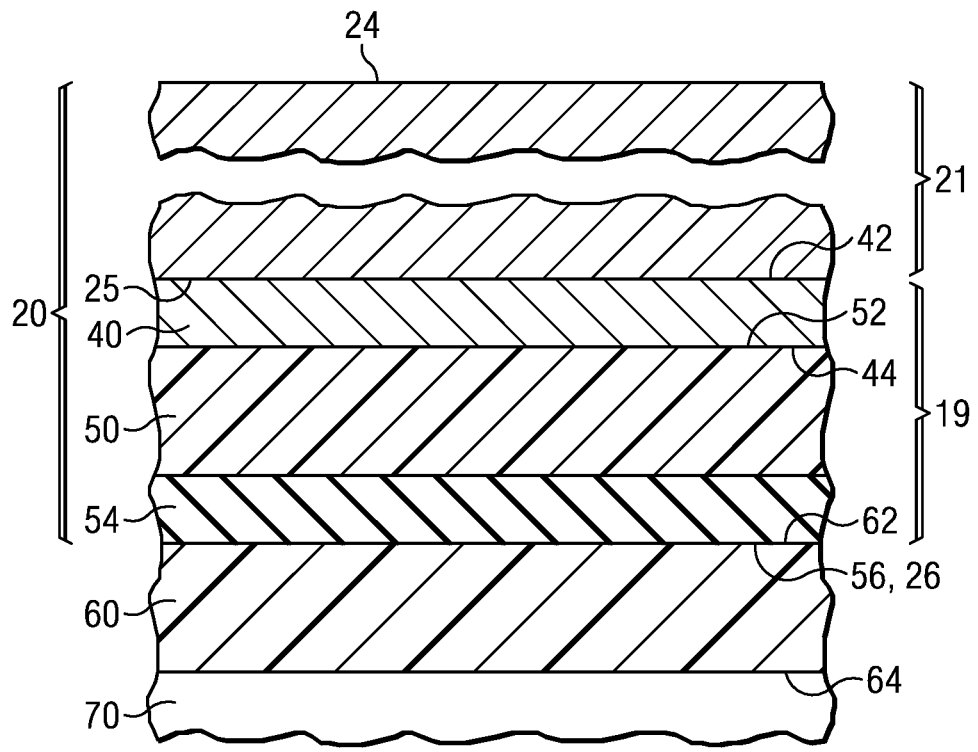
FIG. 6 is a detail, cut away, cross-sectional view of a central body portion of the lid illustrated in FIGS. 1-3 mounted on a die, as illustrated in FIG. 5.

FIG. 6 is a detailed cross sectional view of a central portion of the lid 20 as well as other components. The lid 20 may be divided into a main, heat conductive copper substrate portion 21 and a layered portion 19 that is applied to the main portion. As previously described the copper substrate portion 21 includes a copper central body 22 and a peripheral copper flange 28 which is integrally formed with the central body 22. The layered portion 19 of the lid 20 interfaces with and is positioned below the central body portion 22 of the copper substrate 21. The copper substrate may typically be about 1 mm to 2 mm thick. The layered portion 19 may typically be about 0.025 um (microns) to 7 um thick. As best illustrated by FIG. 6, the layered portion 19 includes a nickel film layer 40, which is formed on the bottom surface 25 of the copper substrate 21. An upper surface 42 of the nickel film layer thus interfaces with the bottom surface 25 of the copper substrate 21. The nickel layer may have a typical thickness of about 0.25 to 6 um. The nickel film layer 40 may be deposited on the bottom surface 25 of the copper substrate 21 by various methods well known in the art including electrolytic deposition and electroless deposition.

A layer of amorphous silicon (a-Si) is deposited on the lower surface 44 of the nickel film layer as by low pressure chemical vapor deposition (LPCVD) or chemical vapor deposition (CVD). Such deposition techniques are well known in the art, see for example U.S. Pat. No. 4,894,352 of Lane et al., issued Jan. 16, 1990 and entitled DEPOSITION OF SILICON-CONTAINING FILMS USING ORGANOSILICON COMPOUNDS AND NITROGEN TRIFLUORIDE, which is hereby incorporated by reference for all that is disclosed therein. After being deposited, the a-Si film is transformed into polycrystalline silicon by a metal induced crystallization mechanism produced by the presence of nickel which reacts with the silicon. This crystallization transformation process takes place spontaneously over time under ambient conditions, and typically takes several hours. Thus, a layer of polycrystalline silicon 50 having an upper surface 52 interfacing with the nickel film layer 40 is provided.

Polycrystalline silicon when exposed to air under ambient conditions spontaneously grows native silicon oxide. At ambient conditions a layer of native silicon oxide about 3 molecules thick (less than 1 nanometer) will typically grow in a few hours. The speed of this process may be increased somewhat by an elevated temperature e.g., about 500° C., at ambient pressure for a period of about 90 minutes. See *Nickel Induced Crystallization of Amorphous Silicon Thin Films* by Zhonghe Jin, Gururaj A. Bhat, Milton Yeung, Hoi S. Kwok, and Man Wong of the Department of Electrical and Electronic Engineering, Hong Kong University of Science and Technology, Clear Water Bay, Kowloon, Hong Kong, JOURNAL OF APPLIED PHYSICS, VOUME 84, NUMBER 1 and also *Growth of Native Oxide on a Silicon Surface* by M. Morita, T. Ohmi, E. Hasegawa, M. Kawakami, and M. Ohwada of Department of Electonics Faculty of Engineering, Tohoku University, Sendai 980, Japan, JOURNAL OF APPLIED PHYSICS, VOUME 68 NUMBER 3, which are both hereby incorporated by reference for all that is disclosed therein. Thus, a layer of native silicon oxide 54 may be provided at the lower portion of the polycrystalline silicon layer 50 simply through exposure of the polycrystalline silicon layer to air. Whether the native silicon oxide growth takes place at normal room temperature or at elevated temperature, there is typically a maximum growth amount which will take place. Growth sufficient to produce a three molecule thick layer of native silicon oxide 54 is sufficient. The lower surface 56 of the native silicon oxide layer 54 forms the bottom of the layered portion 19 and is thus the bottom surface 26 of the lid 20. After the formation of the layered portion 19 of the lid 20 has been completed the lid 20 may be mounted on the substrate 80, as described below.

Having thus described the structure of lid 20 and the manner by which lid 20 is produced, the remaining structure of the lidded IC package 10, as shown in FIGS. 5 and 6 will now be briefly described. The manner in which this structure is assembled will be described in detail later herein.

A layer of thermal interface material 60, which may be a silicone or epoxy resin filled with thermally conductive media, interfaces with the bottom surface 56 of the native silicon oxide layer 54 which is also the bottom surface 26 of the lid 20. The layer of thermal interface material 60 thus has a top surface 62 interfacing with the bottom surface 26 of the lid 20 and a bottom surface 64 interfacing with a top surface 72 of the silicon die 70. The layer of thermal interface material may have a typical thickness of about 10-100 um. (The surface referred to as the top surface 72 of the die in this specification is also frequently referred to as the "back side" of the die in the art. The phrase "top surface" will be used herein to provide an easily understood frame of reference when referring to certain other structure. Similarly the phrase "bottom surface 74" will be used in this specification when referring to the die surface positioned opposite to the "top surface 72" even though the phrase "front side" of the die is often used in the art when referring to this surface.)

As illustrated best by FIG. 5, die 70 may be a flip chip type of die interconnect for a lidded package which is physically and electrically connected to an electrical connection substrate 80. However, it will be understood by those skilled in the art that any other type of die interconnect for a lidded package could also be used. The substrate 80 has a top surface 82 with electrical contacts 83, etc., FIG. 4. The electrical contacts 83, etc., on the electrical connection substrate 80 may be connected to electrical contacts, such as solder bumps 75, on the die 70. The electrical connection substrate 80 also has a bottom surface with a structure such as, for example, a ball grid array 86 that allows the substrate 80 to be physically and electrically connected to a PC board 90.

Having thus described the structure and manner of making lid 20 and the overall structure of lidded IC package 10, the method by which lidded package 10 is assembled will now be described.

The first sequence of operations, known as die attach, involves soldering semiconductor die 70 to the electrical connection substrate 80, which may be an organic substrate or another type of substrate. This operation physically and electrically attaches die 70 to substrate 80. Initially solder paste is applied to the top surface 82 of substrate 80 in the region where die 70 is to be mounted. Next, die 70 is picked up and placed in proper orientation on substrate 80 by a pick and place machine. The layer of solder paste is sandwiched between the bottom surface 74 of die 70 and the top surface 82 of substrate 80. The solder paste is sufficiently tacky to hold die 70 in place during displacement of the die/substrate assembly. Next the die/substrate assembly is moved to a reflow oven (not shown) where it is heated to a predetermined temperature and then maintained at that temperature for a preset period of time. During this heating period the solder paste melts and forms a metallurgical bond with die 70 and substrate 80 once the solder solidifies. This bonding strengthens as the solder cools. Reflow heating of dies and substrates is well understood by those skilled in the art. The reflow oven temperature and heating period will vary depending upon particular die/substrate and/or environmental parameters and may be determined empirically for any particular set of parameters or may be based upon production algorithms and guidelines developed by the fabrication facility. The die 70 is thus rigidly attached to the substrate 80 by a solder layer 76. The die 70 may have solder bumps 75 or other electrical interconnect structure on bottom surface 74, which are adapted to electrically connect the die 70 to bonding pads 83, etc., or the like on the top surface 82 of substrate 80, FIG. 4. Solder paste at 75 melts and bonds to the bonding pads 83, etc., during reflow heating forming solder bumps. The regions beneath the die 70 that are not filled with solder are then packed with a material known as underfill, which relieves stresses that may develop in the solder attached portions of the die and substrate due to heating and cooling cycles, etc. The underfill is then cured in an oven for a set time and duration particular to the material to fully crosslink the underfill and stabilize its viscosity. The mounting and solder attachment of semiconductor dies to substrates with solder, solder bumps and underfill are well known in the art.

The next process performed is called lid attach. The structure of the lid 20 and the method by which it is made are described above. This process of lid formation is completed prior to lid attach. During lid attach, lid adhesive 34 is placed about the periphery of the top surface 82 of substrate 80. At approximately the same time a thermal interface material 60, which may be silicone or epoxy resin with thermally conductive filler media, is applied in paste form to the top surface 72 of die 70. The thermal interface material may be applied by different methods known in the art. In one embodiment the thermal interface material 60 is applied in a predetermined pattern from a syringe in an electronically controlled dispense apparatus. A pick and place machine is then used to place lid 20 on substrate 80. The lid 20 is positioned such that the lower surface 33 of flange foot portion 32 engages the peripheral strip of lid adhesive 34. The depth of the lid 20 and the height of the thermal interface material paste 60 above the die top surface 72 is such that the bottom surface 26 of the lid engages the upper surface 62 of the paste 60 as the lid 20 is mounted on the substrate 80. Downward pressure from the lid 20 causes the paste 60 to spread across the die top surface 72 as the lid 20 is urged downwardly onto substrate 80. Thereafter, a predetermined downward force is maintained on the lid 20 for a predetermined period of time, and at a predetermined temperature, during which the lid adhesive 34 and the thermal material 60 is cured. The time, pressure and temperature may be determined empirically or may be determined analytically from known algorithms and guidelines used at the particular fabrication facility. During the curing process the thermal interface material 60 forms high strength bonds with the native silicon oxide layer 54 of the lid 20 reducing the chance that the thermal interface material will tear away from the lid during subsequent heating and cooling cycles, etc. By thus reducing delamination, heat transfer efficiency between the lid and the thermal interface material is improved. The native silicon oxide layer is atomically flat (<0.1 nm) which further enhances heat transfer by providing more points of contact over the lid surface than conventionally formed silicon oxide layers. The thin native oxide layer also provides more efficient heat transfer than conventional thermal oxide layers, which are much thicker. The native silicon oxide layer is also highly resistant to moisture ingress. Thus a lid/thermal interface material attachment is provided that has improved shear strength and delamination resistance and improved moisture resistance without resorting to the use of high modulus thermal interface materials and/or thicker thermal oxide layers with their resulting heat transfer inefficiencies.

As further illustrated by FIG. 5, heat sink 12 may be installed on top of lid 20. Although this operation may be performed by the lidded package manufacturer, it is more typically performed at the facility of a customer of the manufacturer. The heat sink 12 may be secured to the lid 20 with a thermal interface material 16 such as silicone or epoxy resin with thermally conductive filler media that is applied to the lid. The heat sink 12 is then placed on the lid 20 in a desired orientation by use of a pick and place machine.

The mounting of a heat sink 12 on lid 20 may take place before or after the mounting of the lidded package 10 on a PC board 90, which is shown in dashed lines in FIG. 5. In the embodiment illustrated in FIG. 5, the electrical connection substrate 80 has a ball grid array which is connected to corresponding connection structure (not shown) on the PC board 90. In this embodiment the lidded IC package 10 is placed in the appropriate orientation on the PC board 90 by a pick and place machine. The entire assembly is then moved to a reflow oven and heated until the solder balls of the ball grid array 86 melt and metallurgically bond with contacts on the PC board upon solidification. The method of attachment of ball grid array electrical connection substrates, as well as various other types of electrical connection substrates, to PC boards is well known is the art.

Figure 7:
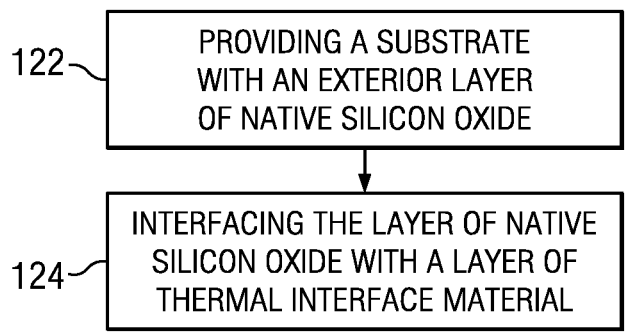
FIG. 7 is a flow diagram of a method of providing a heat path through an integrated circuit package.

FIG. 7 discloses a method of providing a heat path through an integrated circuit package. The method includes, as shown at 122 providing a substrate with an exterior layer of native silicon oxide. The method further includes, as shown at 124, interfacing the layer of native silicon oxide with a layer of thermal interface material.

While certain illustrative embodiments of an integrated circuit package and associated methodology have been described in detail herein, it will be obvious to those with ordinary skill in the art after reading this disclosure that the disclosed integrated circuit package and methodology may be variously otherwise embodied and employed. For example, even though a method for forming a bottom portion of a lid is specifically described, it will be understood by those skilled in the art who have read this disclosure that this same methodology could be employed for forming a top portion of a lid if desired. The appended claims are intended to be broadly construed to include variations which are not excluded by claim language or the prior art.

What is claimed is:

1. A lidded integrated circuit (IC) package comprising:
   a lid having a heat conductive substrate;
   a native silicon oxide layer connected to said heat conductive substrate by at least one intermediate layer; and
   a crystallized amorphous silicon film layer disposed between said heat conductive substrate and said native silicon oxide layer.

2. The lidded integrated circuit (IC) package of claim 1, wherein said lid further comprises:
   a nickel layer disposed between said heat conductive substrate and said native silicon oxide layer.

3. The lidded integrated circuit (IC) package of claim 1, further comprising:
   a semiconductor die having a top surface and a bottom surface; and
   a layer of thermal interface material attached to said top surface of said semiconductor die and to said native silicon oxide layer.

4. The lidded integrated circuit (IC) package of claim 3, wherein said lid comprises a central body portion which comprises said native silicon oxide layer, and a peripheral flange portion; and
   further comprising:
   an electrical connection substrate, wherein said peripheral flange is connected to said electrical connection substrate.

5. The lidded integrated circuit (IC) package of claim 3, wherein said semiconductor die is mounted on said electrical connection substrate.

6. The lidded integrated circuit (IC) package of claim 3, wherein said thermal interface material comprises at least one of silicone and epoxy.

7. The lidded integrated circuit (IC) package of claim 1, wherein said lid comprises:
   a central body portion and a peripheral flange portion, and further comprising:
   a semiconductor die having a top surface and a bottom surface;
   a layer of thermal interface material attached to said top surface of said semiconductor die and to said native silicon oxide layer; and
   an electrical connection substrate, wherein said peripheral flange of said lid is connected to said electrical connection substrate.

8. The lidded integrated circuit (IC) package of claim 7, further comprising:
- a PC board operatively connected to said electrical connection substrate; and
- a heatsink mounted on and which is operatively connected to said lid.

9. A lidded integrated circuit (IC) package comprising:
- a lid having a copper substrate;
- a nickel layer deposited on said copper substrate;
- a crystallized amorphous silicon layer deposited on said nickel layer; and
- a native silicon oxide layer connected to said copper substrate by at least one intermediate layer.

10. The lidded integrated circuit (IC) package of claim 9, wherein said native silicon oxide layer is formed on said crystallized amorphous silicon layer.

\* \* \* \* \*